US008809953B2

(12) United States Patent
Fried et al.

(10) Patent No.: US 8,809,953 B2
(45) Date of Patent: Aug. 19, 2014

(54) FET STRUCTURES WITH TRENCH IMPLANTATION TO IMPROVE BACK CHANNEL LEAKAGE AND BODY RESISTANCE

(75) Inventors: David M. Fried, Brewster, NY (US); Jeffrey B. Johnson, Essex Junction, VT (US); Kevin McStay, Hopewell Junction, NY (US); Paul Parries, Wappingers Falls, NY (US); Chengwen Pei, Danbury, CT (US); Gan Wang, Fishkill, NY (US); Geng Wang, Stormville, NY (US); Yanli Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 13/426,547

(22) Filed: Mar. 21, 2012

(65) Prior Publication Data

US 2012/0187490 A1    Jul. 26, 2012

Related U.S. Application Data

(62) Division of application No. 12/899,635, filed on Oct. 7, 2010, now Pat. No. 8,236,632.

(51) Int. Cl.
*H01L 29/78* (2006.01)

(52) U.S. Cl.
USPC .................................. 257/347; 257/E29.255

(58) Field of Classification Search
None
See application file for complete search history.

(56) References Cited

U.S. PATENT DOCUMENTS 8,236,632 B2 * 8/2012 Fried et al. ................. 438/151
2009/0256201 A1 * 10/2009 Yang et al. .................. 257/347

* cited by examiner

*Primary Examiner* — Seahvosh Nikmanesh
(74) *Attorney, Agent, or Firm* — Ira D. Blecker; Katherine S. Brown; Parashos Kalaitzis

(57) ABSTRACT

A field effect transistor (FET) structure on a semiconductor substrate which includes a gate structure having a spacer on a semiconductor substrate; an extension implant underneath the gate structure; a recessed source and a recessed drain filled with a doped epitaxial material; halo implanted regions adjacent a bottom of the recessed source and drain and being underneath the gate stack. In an exemplary embodiment, there is implanted junction butting underneath the bottom of each of the recessed source and drain, the junction butting being separate and distinct from the halo implanted regions. In another exemplary embodiment, the doped epitaxial material is graded from a lower dopant concentration at a side of the recessed source and drain to a higher dopant concentration at a center of the recessed source and drain. In a further exemplary embodiment, the semiconductor substrate is a semiconductor on insulator substrate.

20 Claims, 5 Drawing Sheets

FET STRUCTURES WITH TRENCH IMPLANTATION TO IMPROVE BACK CHANNEL LEAKAGE AND BODY RESISTANCE

This application is a divisional of U.S. patent application Ser. No. 12/899,635 entitled "FET STRUCTURES WITH TRENCH IMPLANTATION TO IMPROVE BACK CHANNEL LEAKAGE AND BODY RESISTANCE", filed Oct. 7, 2010, the disclosure of which is incorporated by reference herein.

BACKGROUND

The present invention relates to the field of improving the parasitic leakage of MOSFET (metal oxide semiconductor field effect transistor) structures for semiconductors and, more particularly, relates to FET (field effect transistor) structures and processes having features to reduce leakage in the back channel of the FET, to reduce leakage under the source/drain junction and to reduce FET body resistance without interfering with the threshold voltage of the FET structure.

In present day semiconductor technology and beyond, high peak junction field, back channel leakage, and under junction leakage are impacting semiconductor reliability. This is particularly true for eDRAM which need back gating or side gating well controlled for high retention and yield and SRAM semiconductor structures. This is also true for analog devices which need low body resistance but the low body resistance may interfere with threshold voltage.

BRIEF SUMMARY

The various advantages and purposes of the exemplary embodiments as described above and hereafter are achieved by providing, according to a first aspect of the exemplary embodiments, a field effect transistor (FET) structure on a semiconductor substrate including a gate structure having a spacer on a semiconductor substrate wherein the semiconductor substrate is a semiconductor on insulator substrate comprising a semiconductor layer on a buried oxide layer; an extension implant underneath the gate structure; a recessed source and a recessed drain filled with a doped epitaxial material such that a dopant concentration of the doped epitaxial material is graded from a lower dopant concentration at a side of the recessed source and drain to a higher dopant concentration at a center of the recessed source and drain; and halo implanted regions adjacent a bottom of the recessed source and drain and being underneath the gate stack and being in contact with the buried oxide layer.

According to a second aspect of the exemplary embodiments, there is provided a field effect transistor (FET) structure on a semiconductor substrate including a gate structure having a spacer on a semiconductor substrate wherein the semiconductor substrate is a semiconductor on insulator substrate comprising a semiconductor layer on a buried oxide layer; an extension implant underneath the gate structure; a recessed source and a recessed drain filled with a doped epitaxial material, the FET structure having a body portion underneath the gate structure and between the recessed source and drain; halo implanted regions adjacent a bottom of the recessed source and drain and being underneath the gate stack and in a bottom part of the body portion and being in contact with the buried oxide layer; and implanted junction butting underneath the bottom of each of the recessed source and drain and the junction butting being in contact with the buried oxide layer, the junction butting being separate and distinct from the halo implanted regions.

According to a third aspect of the exemplary embodiments, there is provided a field effect transistor (FET) structure on a semiconductor substrate including a gate structure having a spacer on a semiconductor substrate; an extension implant underneath the gate structure; a recessed source and a recessed drain filled with a doped epitaxial material, the FET structure having a body portion underneath the gate structure and between the recessed source and drain; halo implanted regions adjacent a bottom of the recessed source and drain and being underneath the gate stack and in a bottom part of the body portion; and implanted junction butting underneath the bottom of each of the recessed source and drain, the junction butting being separate and distinct from the halo implanted regions.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 7 describe a first exemplary embodiment of forming an FET structure with trench implantation wherein:

FIG. 1 illustrates a first process step in forming the first exemplary embodiment wherein a gate structure having first spacers is formed on a semiconductor substrate;

FIG. 2 illustrates a next process step in forming the first exemplary embodiment wherein extension implants are formed in the semiconductor substrate;

FIG. 3 illustrates a next process step in forming the first exemplary embodiment wherein second spacers are formed on the gate structure and then source and drain recesses are formed in the semiconductor substrate;

FIG. 4 illustrates a next process step in forming the first exemplary embodiment wherein tilt angle halo implants are done through the source and drain recesses.

FIG. 5 illustrates a next process step in forming the first exemplary embodiment wherein junction butting implants are done through the source and drain recesses;

FIG. 6 illustrates a next process step in forming the first exemplary embodiment wherein doped epitaxial layers having different concentrations of dopant are formed in the source and drain recesses; and FIG. 7 illustrates the structure of the first exemplary embodiment wherein dose activation has been performed to result in a graded recessed source and drain.

DETAILED DESCRIPTION

Figure 1:
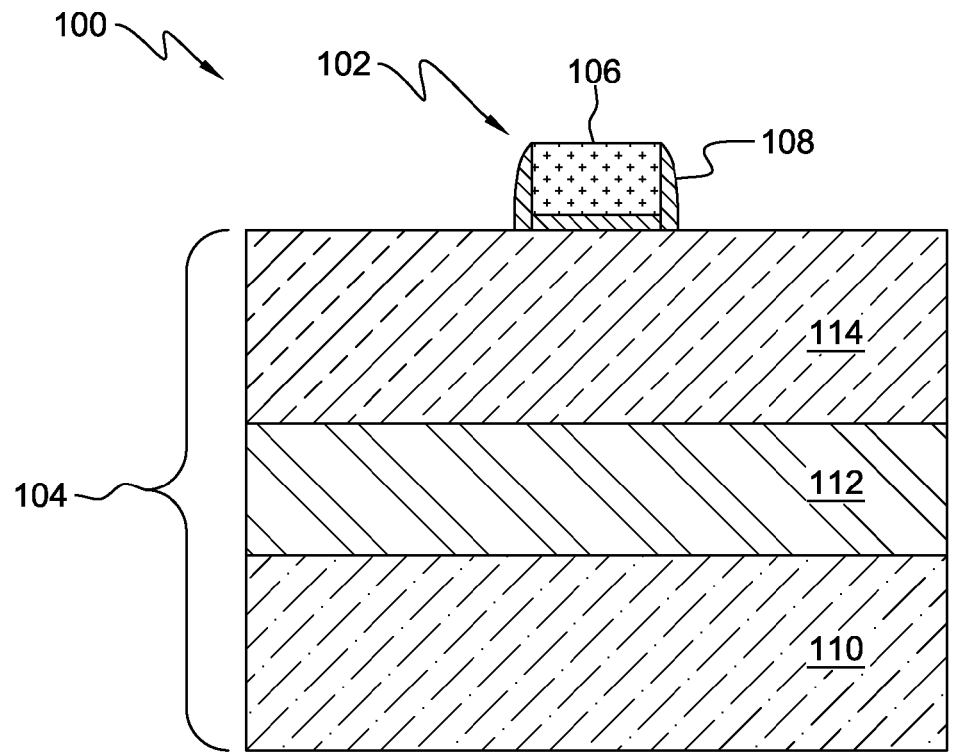

Referring to the Figures in more detail, and particularly referring to FIG. 1, there is shown a semiconductor structure 100 (an FET in the exemplary embodiment) having a gate structure 102 formed on a semiconductor substrate 104. In an exemplary embodiment, semiconductor substrate 104 is a bulk semiconductor. In a preferred exemplary embodiment, semiconductor substrate 104 is a semiconductor on insulator (SOI) substrate which includes a semiconductor layer 114 on a buried oxide (BOX) layer. The SOI structure is typically built on a semiconductor wafer 110.

The semiconductor material that makes up semiconductor substrate 104 if it is a bulk semiconductor may include but not be limited to group IV semiconductors such as silicon, silicon germanium or germanium, a III-V compound semiconductor, or a II-VI compound semiconductor. Similarly, in the preferred exemplary embodiment, semiconductor layer 114 and semiconductor wafer 110 may include but not be limited to group IV semiconductors such as silicon, silicon germanium or germanium, a III-V compound semiconductor, or a II-VI compound semiconductor. Buried oxide layer 112 may be silicon oxide or other dielectric materials.

The remainder of the discussion will focus on the SOI structure shown in FIG. 1.

Gate structure 102 includes a gate stack 106 and first spacers 108. In an exemplary embodiment, the gate stack 106 may comprise a high k dielectric material in contact with SOI layer 114, metal gate material in contact with the high k dielectric material and polysilicon material in contact with the metal gate material. The gate stack 106 may be formed by blanket depositing layers of high k dielectric material, metal gate material and polysilicon material and then defining the gate stack 106 by etching away the portions of the layers that are not needed for the gate stack 106. The etching may be done by reactive ion etching. The materials for gate stack 106 and the method for forming the gate stack 106 are conventional. For purposes of illustration and not limitation, the high k dielectric material may include but not be limited to nitride hafnium silicate, hafnium silicate, zirconium silicate, hafnium dioxide and zirconium dioxide. For purpose of illustration and not limitation, the metal gate materials may include but not be limited to metals such as tungsten, nickel, cobalt and copper; carbides such as titanium carbide, zirconium carbide, tantalum carbide and tungsten carbide; and nitrides such as titanium nitride and tantalum nitride.

An insulating material, such as silicon nitride is deposited, defined and then reactive ion etched to form first spacers 108.

Figure 2:
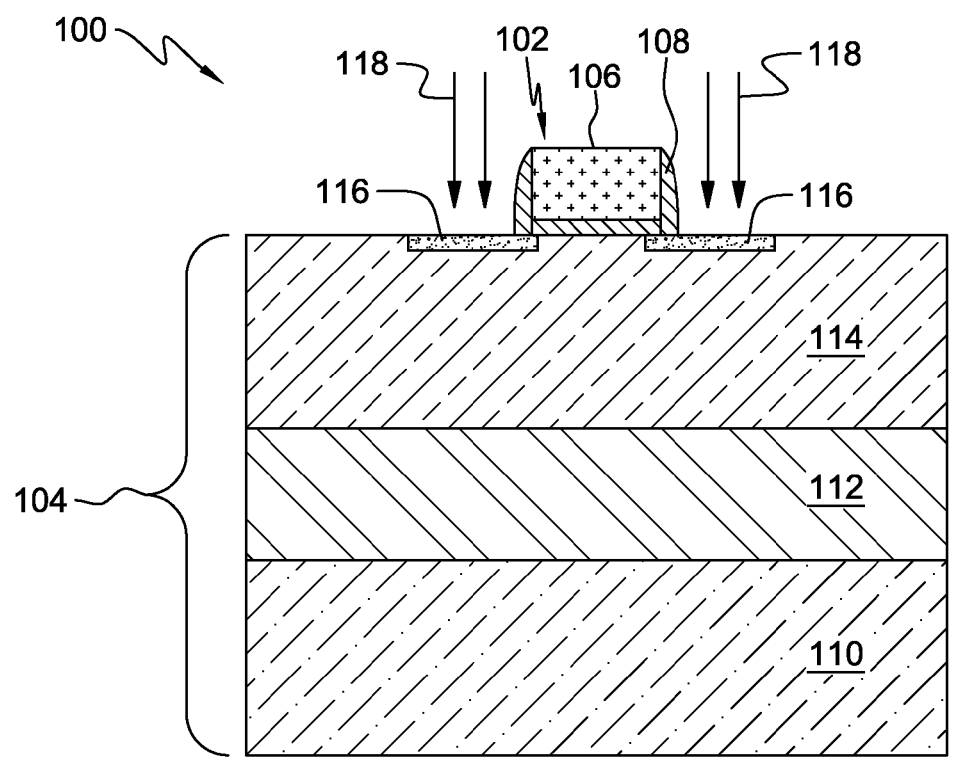

Referring now to FIG. 2, extension implants 116 are conventionally formed in semiconductor substrate 104 by implanting 118, for example, arsenic (As) or phosphorus (P) for an NFET or boron (B) or boron difluoride (BF$_2$) for a PFET.

Figure 3:
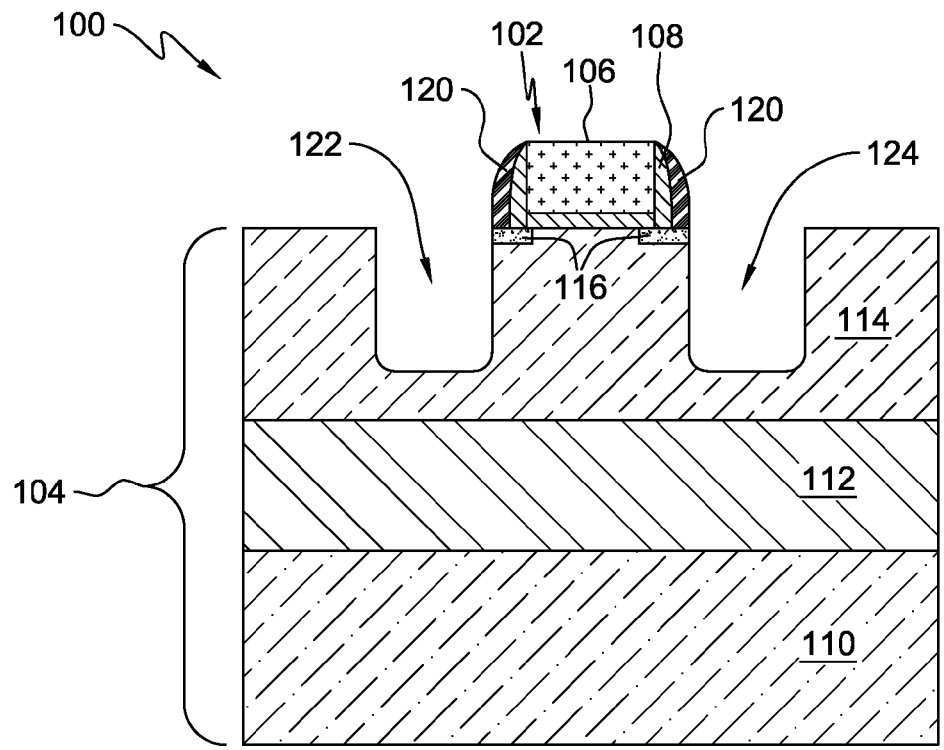

Referring now to FIG. 3, an insulating material, such as silicon nitride, is deposited, defined and then reactive ion etched to form second spacers 120. Semiconductor structure 100 may be patterned by a conventional lithography process and a silicon nitride hardmask and etched, for example, by reactive ion etching to form source recess 122 and drain recess 124. Source recess 122 and drain recess 124 extend a substantial way through SOI layer 114.

Figure 4:
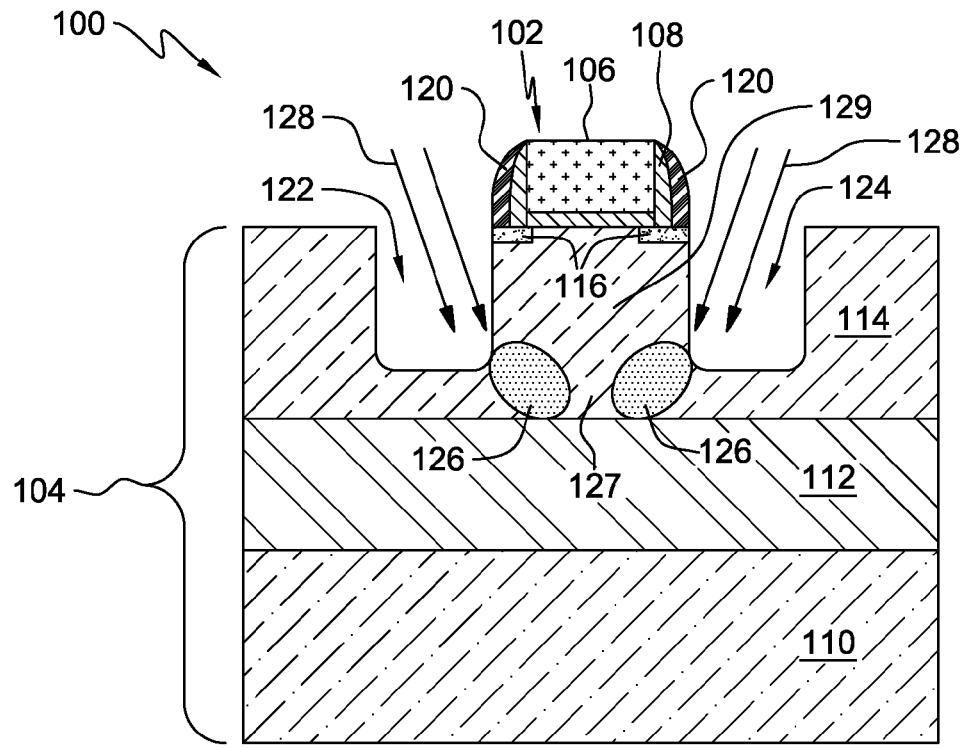

Halo implants 126 are done by tilt angle implanting at about 0 to 45 degrees, typically 15 to 30 degrees, of, for example, boron or boron difluoride for an NFET or arsenic or phosphorus for a PFET, into the bottom of source recess 122 and drain recess 124. The halo implants 126 through the source recess 122 and drain recess 124 shut off back gating leakage (back channel leakage) or side gating leakage, such as that from adjacent node gating, which is critical for high performance, long retention devices such as DRAM. As shown in FIG. 4, the halo implants 126 are under the gate stack 106 and near to BOX layer 112 in the low part 127 of the semiconductor structure (FET) body 129. In a preferred exemplary embodiment, halo implants 126 should contact BOX layer 112. The halo implants have been found to be effective in reducing backchannel leakage and side gating leakage.

Figure 5:
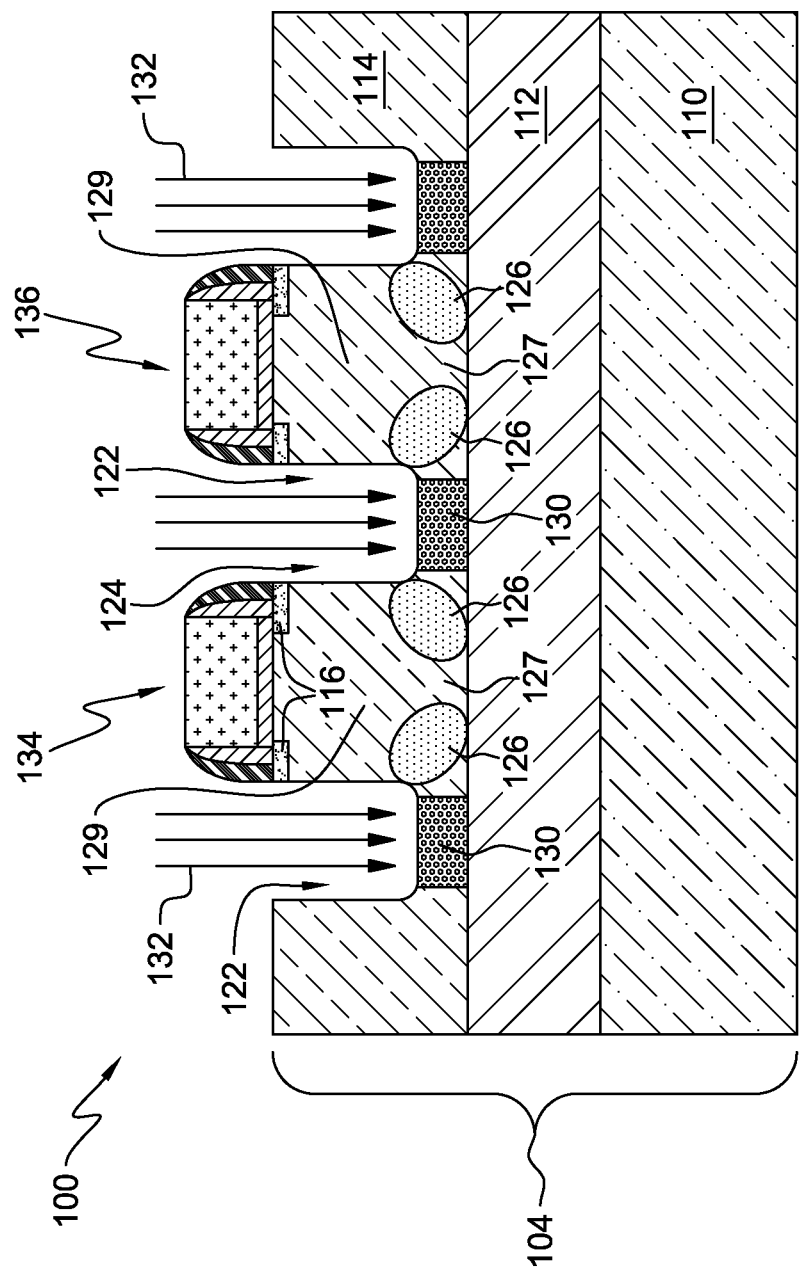

Junction butting implants 130 are done by vertical implanting 132 of, for example, arsenic or phosphorus for an NFET or boron or boron difluoride for a PFET, at the bottom of source recess 122 and drain recess 124. In a preferred exemplary embodiment, junction butting implants 130 are in contact with BOX layer 112. As shown in FIG. 5, there are a plurality of gate structures 134, 136 with each gate structure 134, 136 being for a different FET (Field Effect Transistor) device. In such an arrangement, the drain of one gate structure 134 may serve as the source for another gate structure 136. The junction butting implants 130 provide strong junction butting to BOX layer 112 in the preferred exemplary embodiment to shut off under junction leakage from the body of one FET device to the body of an adjacent FET device which shares the same contact, to shut off cross talk in circuits.

Figure 6:
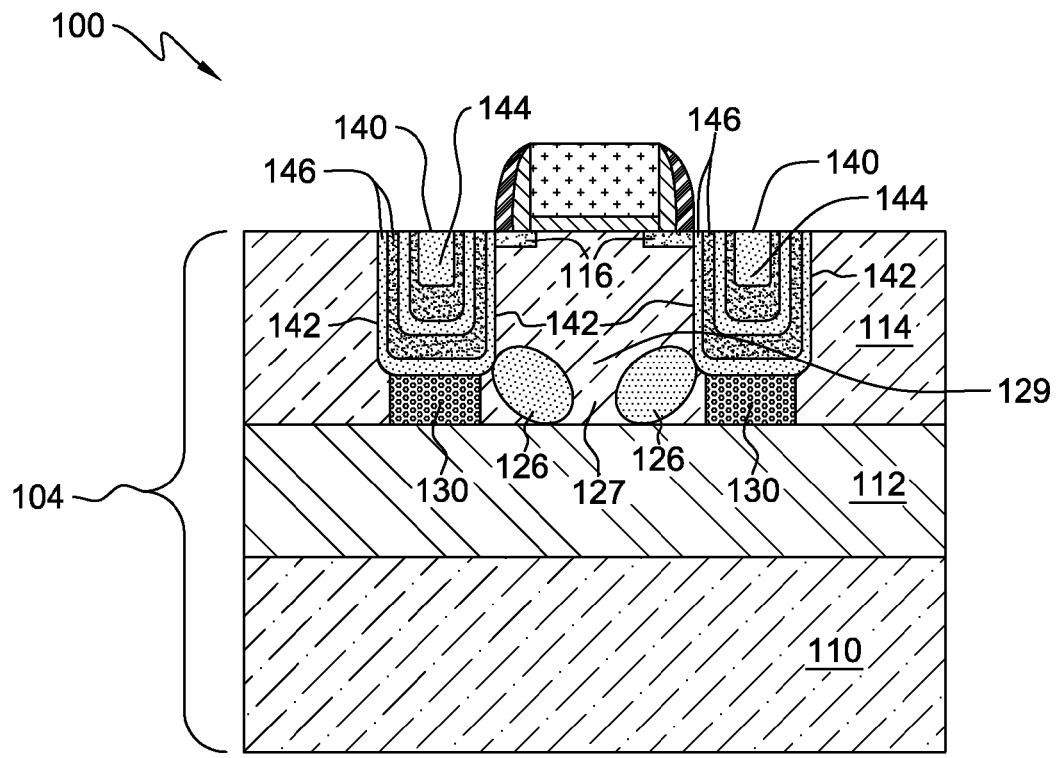

Referring now to FIG. 6, source recess 122 and drain recess 124 have been filled with doped epitaxial material 140. In an exemplary embodiment, the doped epitaxial material 140 includes layers of epitaxial material with adjacent layers having different dopant concentrations so that the doped epitaxial material 140 achieves a graded doping profile. The doped epitaxial material 140 may be, for example, silicon carbide (SiC) with phosphorus or arsenic doping for an NFET. In another exemplary embodiment, the epitaxial material 140 could be silicon germanium (SiGe) doped with boron or boron difluoride for a PFET. The doped epitaxial material 140 may be graded such that the outer layers 146 near sides 142 of the source and drain recesses 122, 124 are lightly doped while the center 144 of the doped epitaxial material 140 is more highly doped. Portions of the doped epitaxial material 140 between the sides 142 of the source and drain recesses 122, 124 and the center 144 have a dopant concentration intermediate between that of the sides 142 and the center 144. The multiple layers with calculated in situ doping concentration during epitaxy provide a well-graded junction profile after activation, reduce junction leakage and improve yield.

Figure 7:
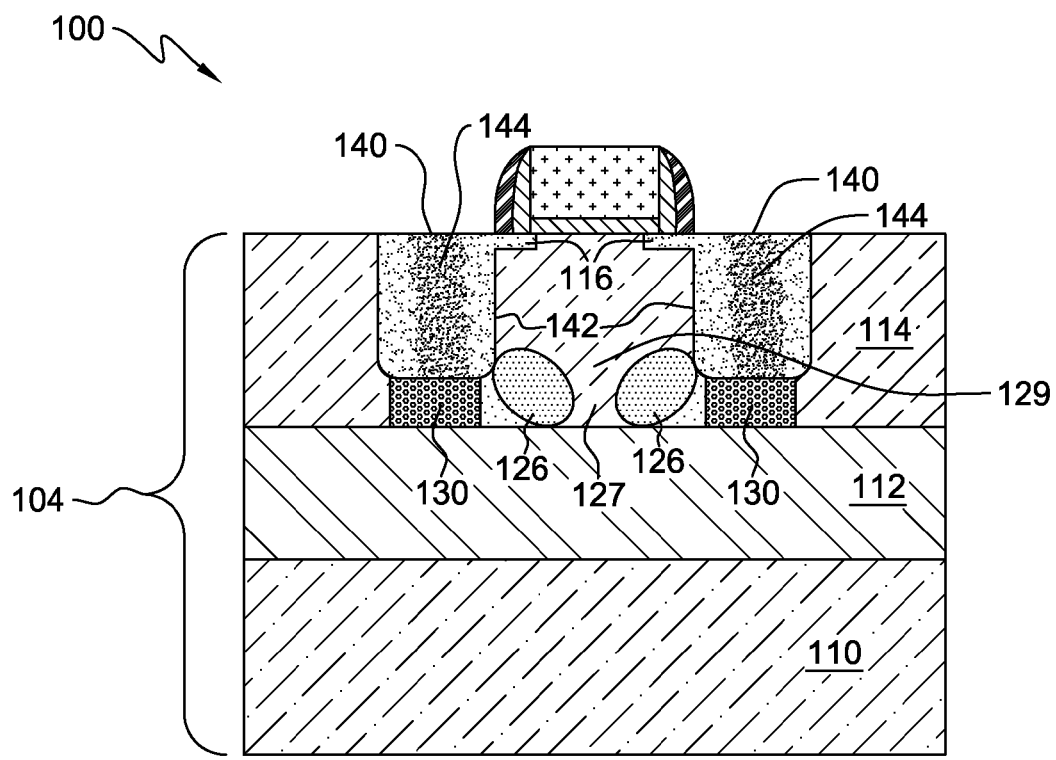

The semiconductor structure 100 then undergoes dose activation at about 800 to 1000° C. for about 1 millisecond to result in the structure shown in FIG. 7. The individual layers of the doped epitaxial material 140 become comingled as one layer with a graded dopant concentration as discussed above. Dose activation may be by a process such as rapid thermal anneal (RTA).

Processing of the semiconductor structure 100 then continues with further integrated circuit formation processing and back end of the line processing to form completed semiconductor devices.

Figure 8:
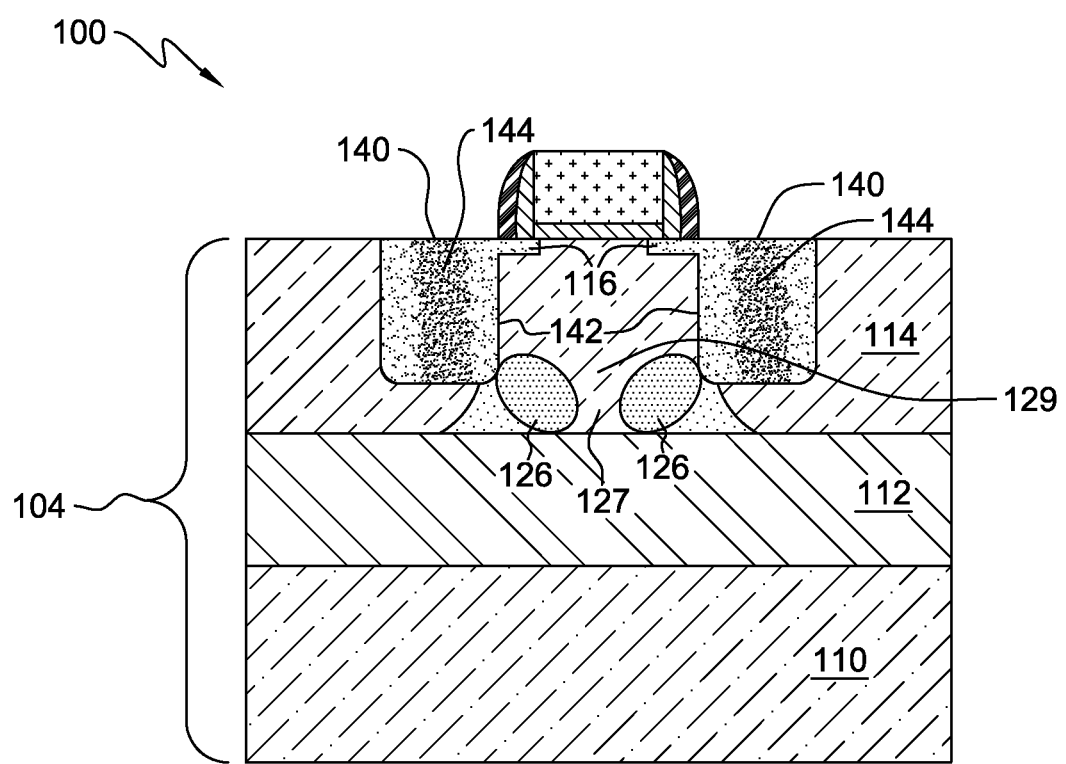
FIG. 8 illustrates the structure of a second exemplary embodiment wherein the junction butting implants have been omitted.

FIG. 8 is another embodiment of the present invention. The semiconductor structure 100' of FIG. 8 is identical to the embodiment shown in FIG. 7 except that in the embodiment in FIG. 8, there is no junction butting. In the embodiment of FIG. 8, there is low body resistance without affecting or increasing front threshold voltage. That is, for certain applications such as analog devices which need low body resistance, meaning higher doping level in body, the higher doping level usually interferes with threshold voltage and could not decouple from adjacent FET devices. With the method of trench implant described in the exemplary embodiments, more dose comes to the low part of the FET body so body resistance is reduced without increasing threshold voltage.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A field effect transistor (FET) structure on a semiconductor substrate comprising:
a gate structure having a spacer on a semiconductor substrate wherein the semiconductor substrate is a semiconductor on insulator substrate comprising a semiconductor layer on a buried oxide layer;
an extension implant underneath the gate structure;
a recessed source and a recessed drain filled with a doped epitaxial material such that a dopant concentration of the doped epitaxial material is graded from a lower dopant concentration at a side of the recessed source and drain to a higher dopant concentration at a center of the recessed source and drain; and
halo implanted regions adjacent a bottom of the recessed source and drain and being underneath the gate stack and being in contact with the buried oxide layer.

2. The FET structure of claim 1 further comprising implanted junction butting underneath the bottom of each of the recessed source and drain and the junction butting being in contact with the buried oxide layer, the junction butting being separate and distinct from the halo implanted regions.

3. The FET structure of claim 1 wherein the doped epitaxial material in each of the recessed source and drain comprises a plurality of doped epitaxial layers.

4. The FET structure of claim 3 wherein a dopant concentration of the plurality of doped epitaxial layers varies from layer to layer.

5. The FET structure of claim 2 wherein the junction butting comprises arsenic, phosphorus, boron or boron difluoride.

6. The FET structure of claim 1 having a body portion underneath the gate structure and between the recessed source and drain and having the halo implants in a low part of the body portion so that body resistance is reduced without increasing threshold voltage.

7. The FET structure of claim 6 wherein the halo implanted regions are wholly within the body portion.

8. A field effect transistor (FET) structure on a semiconductor substrate comprising:
a gate structure having a spacer on a semiconductor substrate wherein the semiconductor substrate is a semiconductor on insulator substrate comprising a semiconductor layer on a buried oxide layer;
an extension implant underneath the gate structure;
a recessed source and a recessed drain filled with a doped epitaxial material, the FET structure having a body portion underneath the gate structure and between the recessed source and drain;
halo implanted regions adjacent a bottom of the recessed source and drain and being underneath the gate stack and in a bottom part of the body portion and being in direct contact with the buried oxide layer; and
implanted junction butting underneath the bottom of each of the recessed source and drain and the junction butting being in contact with the buried oxide layer, the junction butting being separate and distinct from the halo implanted regions.

9. The FET structure of claim 8 wherein the doped epitaxial material in each of the recessed source and drain comprises a plurality of doped epitaxial layers.

10. The FET structure of claim 9 wherein a dopant concentration of the plurality of doped epitaxial layers varies from layer to layer.

11. The FET structure of claim 9 wherein a dopant concentration of the plurality of doped epitaxial layers is graded from a lower dopant concentration at a side of the source and drain recesses to a higher dopant concentration at a center of the source and drain recesses.

12. The FET structure of claim 8 wherein a dopant concentration of the doped epitaxial material in each of the source and drain recesses is graded from a lower dopant concentration at a side of the source and drain recesses to a higher dopant concentration at a center of the source and drain recesses.

13. The FET structure of claim 8 wherein the junction butting comprises arsenic, phosphorus, boron or boron difluoride.

14. The FET structure of claim 8 wherein the halo implanted regions are wholly within the body portion.

15. A field effect transistor (FET) structure on a semiconductor substrate comprising:
a gate structure having a spacer on a semiconductor substrate;
an extension implant underneath the gate structure;
a recessed source and a recessed drain filled with a doped epitaxial material, the FET structure having a body portion underneath the gate structure and between the recessed source and drain;
halo implanted regions adjacent a bottom of the recessed source and drain and being underneath the gate stack and in a bottom part of the body portion and being in direct contact with a buried oxide layer; and
implanted junction butting underneath the bottom of each of the recessed source and drain, the junction butting being separate and distinct from the halo implanted regions.

16. The FET structure of claim 15 wherein the doped epitaxial material in each of the source and drain recesses comprises a plurality of doped epitaxial layers.

17. The FET structure of claim 16 wherein a dopant concentration of the plurality of doped epitaxial layers varies from layer to layer.

18. The FET structure of claim 16 wherein a dopant concentration of the plurality of doped epitaxial layers is graded from a lower dopant concentration at a side of the source and drain recesses to a higher dopant concentration at a center of the source and drain recesses.

19. The FET structure of claim 15 wherein a dopant concentration of the doped epitaxial material in each of the source and drain recesses is graded from a lower dopant concentration at a side of the source and drain recesses to a higher dopant concentration at a center of the source and drain recesses.

20. The FET structure of claim 15 wherein the halo implanted regions are wholly within the body portion.

* * * * *